(12) United States Patent
Okino et al.

(10) Patent No.: US 8,704,321 B2
(45) Date of Patent: Apr. 22, 2014

(54) SOLID-STATE IMAGING DEVICE

(75) Inventors: Toru Okino, Osaka (JP); Yoshihisa Kato, Shiga (JP); Yutaka Hirose, Kyoto (JP); Mitsuyoshi Mori, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/462,889

(22) Filed: May 3, 2012

(65) Prior Publication Data

US 2012/0217494 A1 Aug. 30, 2012

Related U.S. Application Data

(63) Continuation of application No. PCT/JP2010/004921, filed on Aug. 5, 2010.

(30) Foreign Application Priority Data

Nov. 5, 2009 (JP) .................................. 2009-254404

(51) Int. Cl.
*H01L 29/51* (2006.01)
(52) U.S. Cl.
USPC ........... 257/431; 257/432; 257/433; 257/200; 257/292; 257/208; 257/460; 257/E31.053; 257/E31.127
(58) Field of Classification Search
USPC ................. 257/431, 432, 433, 292, 200, 206, 257/208.1, 460, E31.053, E31.127
See application file for complete search history.

(56) References Cited

U.S. PATENT DOCUMENTS

| | | | | |
|---|---|---|---|---|
| 7,119,334 B2* | 10/2006 | Secundo et al. | ............... | 250/331 |
| 7,525,131 B2* | 4/2009 | Sumiya et al. | ................. | 257/184 |
| 7,821,019 B2* | 10/2010 | Osinsky et al. | ................. | 257/97 |
| 7,956,369 B2* | 6/2011 | Reed et al. | ....................... | 257/94 |
| 8,097,928 B2* | 1/2012 | Ikeda et al. | .................... | 257/431 |
| 8,101,972 B2* | 1/2012 | Hikita et al. | ................... | 257/194 |
| 8,106,403 B2* | 1/2012 | McLaurin | ....................... | 257/79 |
| 8,164,115 B2* | 4/2012 | Hikita et al. | ................... | 257/192 |
| 8,227,793 B2* | 7/2012 | Ahn | ................................ | 257/21 |
| 8,269,222 B2* | 9/2012 | Shen et al. | ....................... | 257/77 |
| 8,269,223 B2* | 9/2012 | Wraback et al. | ................. | 257/77 |
| 8,288,836 B2* | 10/2012 | Oshiyama et al. | ............. | 257/432 |
| 8,373,153 B2* | 2/2013 | Ahn | ................................ | 257/14 |
| 8,385,099 B2* | 2/2013 | Kaneko et al. | ................. | 365/145 |

(Continued)

FOREIGN PATENT DOCUMENTS

| JP | 04-038872 | 2/1992 |
|---|---|---|
| JP | 04-343472 | 11/1992 |

(Continued)

OTHER PUBLICATIONS

International Search Report of PCT Application No. PCT/JP2010/004921 dated Sep. 21, 2010.

*Primary Examiner* — Michael Shingleton
(74) *Attorney, Agent, or Firm* — Panasonic Patent Center (57) ABSTRACT

Solid-state imaging device of the present invention is a backside-illumination-type solid-state imaging device including wiring layer formed on first surface side of semiconductor substrate; and light receiving section that photoelectrically converts light incident from second surface side that is opposite from first surface side, wherein spontaneous polarization film formed of a material having spontaneous polarization is formed on a light receiving surface of light receiving section. Accordingly, a hole accumulation layer can be formed on the light receiving surface of light receiving section, and a dark current can be suppressed.

14 Claims, 8 Drawing Sheets

(56) References Cited

U.S. PATENT DOCUMENTS

| | | | |
|---|---|---|---|
| 8,390,029 B2* | 3/2013 | Umeda et al. | 257/192 |
| 8,415,761 B2* | 4/2013 | Mantese | 257/470 |
| 2004/0001778 A1 | 1/2004 | Chen et al. | |
| 2005/0224849 A1* | 10/2005 | Isenberger et al. | 257/295 |
| 2005/0277208 A1* | 12/2005 | Nakazawa et al. | 438/3 |
| 2007/0096077 A1* | 5/2007 | Sanga et al. | 257/13 |
| 2008/0251816 A1 | 10/2008 | Tanaka et al. | |
| 2009/0096049 A1 | 4/2009 | Oshiyama et al. | |
| 2009/0152607 A1 | 6/2009 | Tanaka et al. | |
| 2009/0189235 A1* | 7/2009 | Ikeda et al. | 257/432 |
| 2010/0193669 A1 | 8/2010 | Yamaguchi et al. | |
| 2010/0200942 A1 | 8/2010 | Oshiyama et al. | |
| 2010/0203669 A1 | 8/2010 | Oshiyama et al. | |
| 2010/0289004 A1* | 11/2010 | Nakahara et al. | 257/15 |
| 2011/0089312 A1 | 4/2011 | Oshiyama et al. | |
| 2011/0089313 A1 | 4/2011 | Oshiyama et al. | |
| 2011/0143488 A1* | 6/2011 | Ikeda et al. | 438/75 |
| 2012/0217494 A1* | 8/2012 | Okino et al. | 257/43 |
| 2013/0020663 A1* | 1/2013 | Takimoto | 257/431 |
| 2013/0026382 A1* | 1/2013 | Yao et al. | 250/372 |
| 2013/0033628 A1* | 2/2013 | Yamaguchi | 348/294 |

FOREIGN PATENT DOCUMENTS

| | | |
|---|---|---|
| JP | 06-21064 | 1/1994 |
| JP | 08-310813 | 11/1996 |
| JP | 10-167896 | 6/1998 |
| JP | 2002-203916 | 7/2002 |
| JP | 2003-37268 | 2/2003 |
| JP | 2005-533371 | 11/2005 |
| JP | 2007-165805 | 6/2007 |
| JP | 2008-270259 | 11/2008 |
| JP | 2008-306154 | 12/2008 |
| JP | 2008-306160 | 12/2008 |
| JP | 2009-152235 | 7/2009 |
| JP | 2009-218438 | 9/2009 |

* cited by examiner

- Zn atom
- O atom

FIG. 5

- H atom
- F atom
- C atom

--PRIOR ART--

SOLID-STATE IMAGING DEVICE

BACKGROUND

1. Technical Field

The present invention relates to a solid-state imaging device in which a plurality of light receiving sections made of pn photodiodes and the like are formed on a semiconductor substrate, and particularly relates to a backside-illumination-type solid-state imaging device having a wiring layer formed on one surface of a semiconductor substrate and a light receiving section that photoelectrically converts light incident from the other surface of the semiconductor substrate.

2. Background Art

In recent years, high quality and compactness are desired for a solid-state imaging device, and pixel size reduction is frequently adapted. However, the pixel size reduction has physical limitations, and there is an occurring problem that an area of a photodiode for converting light into electric signals must be made smaller as the pixel size becomes smaller, and sensitivity to light diminishes.

In a typical solid-state imaging device, a wiring for outputting the signals converted in each photodiode to outside is formed on a semiconductor substrate on which a plurality of photodiodes are formed. Since light is made incident from a side of the surface on which the wiring of the solid-state imaging device is formed, light is collected by using a microlens and the like so that the incident light can pass though the wiring. However, when the wiring becomes complicated and becomes a multilayer wiring, even if the light is collected by the microlens, vignetting of the incident light occurs due to obstacles such as the wiring, and it becomes impossible to obtain sufficient sensitivity.

Thus, recently, a backside-illumination-type solid-state imaging device that injects the light from a surface on an opposite side of a surface onto which a wiring is formed is proposed. With the backside-illumination-type structure, it is possible to make an aperture ratio of each pixel ideally at 100%, and the sensitivity can be maintained even if the pixel size is reduced. However, since the backside-illumination-type solid-state imaging device is configured to inject the light from the surface on the opposite side of the surface onto which the wiring is formed, in order to manufacture the backside-illumination-type solid-state imaging device, a special manufacturing process is necessary for thinning a thickness of the semiconductor substrate onto which the light receiving sections are formed.

As a method of manufacturing the backside-illumination-type solid-state imaging device, typically, a method that uses an SOI (Silicon On Insulator) substrate is known, in which after having formed respective layers such as the light receiving sections, the wiring, and the like on the SOI substrate, a supporting substrate is bonded thereto, and the silicon substrate on a back surface side of the supporting substrate is removed. However, in removing the silicon substrate, damage is applied to light receiving sections, and defect levels of a substrate interface are generated in the light receiving sections by this damage. In this case, there had been a problem that, even if the solid-state imaging device is in a darkened state (a state in which no signal charge is present that is to be photoelectrically converted in the light receiving sections), charges are detected by the defect levels of the substrate interface in the light receiving sections, and the dark current (noise current) is generated. Accordingly, even if the sensitivity to the incident light is increased by employing the backside-illumination-type solid-state imaging device, whereas on the other hand if the dark current increases, it practically becomes impossible to use it as the solid-state imaging device.

Conventionally, techniques to prevent this dark current have been proposed (refer to Unexamined Japanese Patent Publication No. 114-38872, Unexamined Japanese Patent Publication No. 2008-306154, and Unexamined Japanese Patent Publication No. 2008-306160). Hereinbelow, two conventional techniques for preventing the dark current will be described with reference to the drawings.

Figure 8:
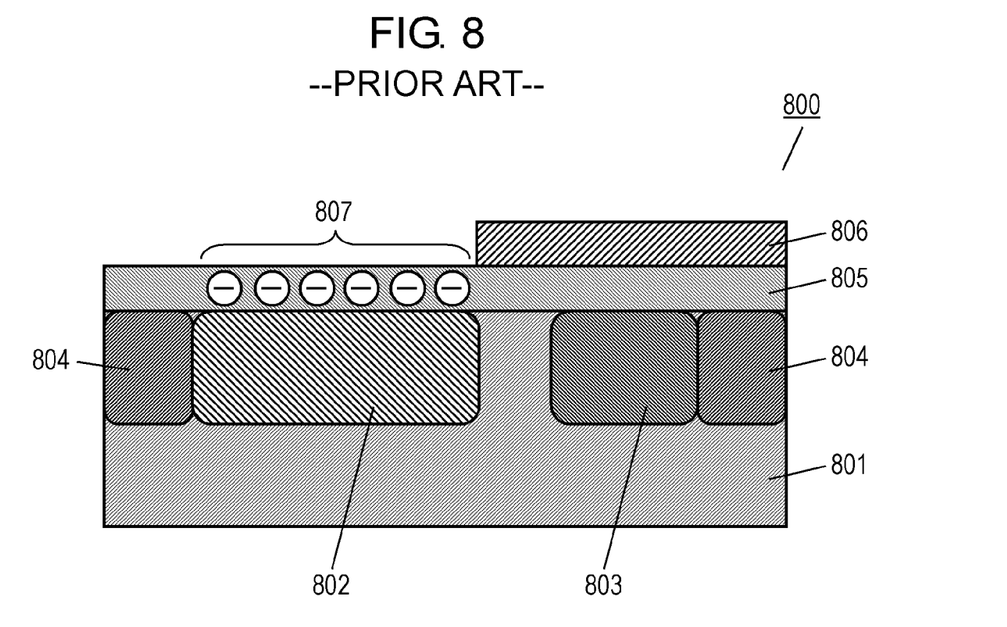
FIG. 8 is a cross-sectional view of a solid-state imaging device of a first conventional technique.

FIG. 8 is a cross-sectional view of a solid-state imaging device of a first conventional technique disclosed in Unexamined Japanese Patent Publication No. 114-38872.

As shown in FIG. 8, solid-state imaging device 800 of the first conventional technique includes p-type semiconductor substrate 801, first n-type semiconductor layer 802 and second n-type semiconductor layer 803 formed on p-type semiconductor substrate 801, p-type semiconductor layers 804 formed on p-type semiconductor substrate 801, silicon oxide film 805 formed on first n-type semiconductor layer 802, second n-type semiconductor layer 803, and p-type semiconductor layers 804, and gate electrode 806 formed on silicon oxide film 805 above second n-type semiconductor layer 803 and p-type semiconductor layer 804.

Further, in solid-state imaging device 800 of the first conventional technique, negative fixed charges are embedded by implanting aluminum ions into silicon oxide film 805, whereby negative charge region 807 is formed. That is, negative charge region 807 as a hole accumulation layer is formed by bringing up a surface potential of p-type semiconductor substrate 801. In this way, the solid-state imaging device of the first conventional technique configures an insulation film interface between p-type semiconductor substrate 801 and silicon oxide film 805 to be non-depleted by forming the hole accumulation layer, and thereby electrons generated at an interface level is suppressed, and an occurrence of dark current is prevented.

Next, solid-state imaging devices of a second conventional technique disclosed in Unexamined Japanese Patent Publication No. 2008-306154, Unexamined Japanese Patent Publication No. 2008-306160 will be described.

Figure 9:
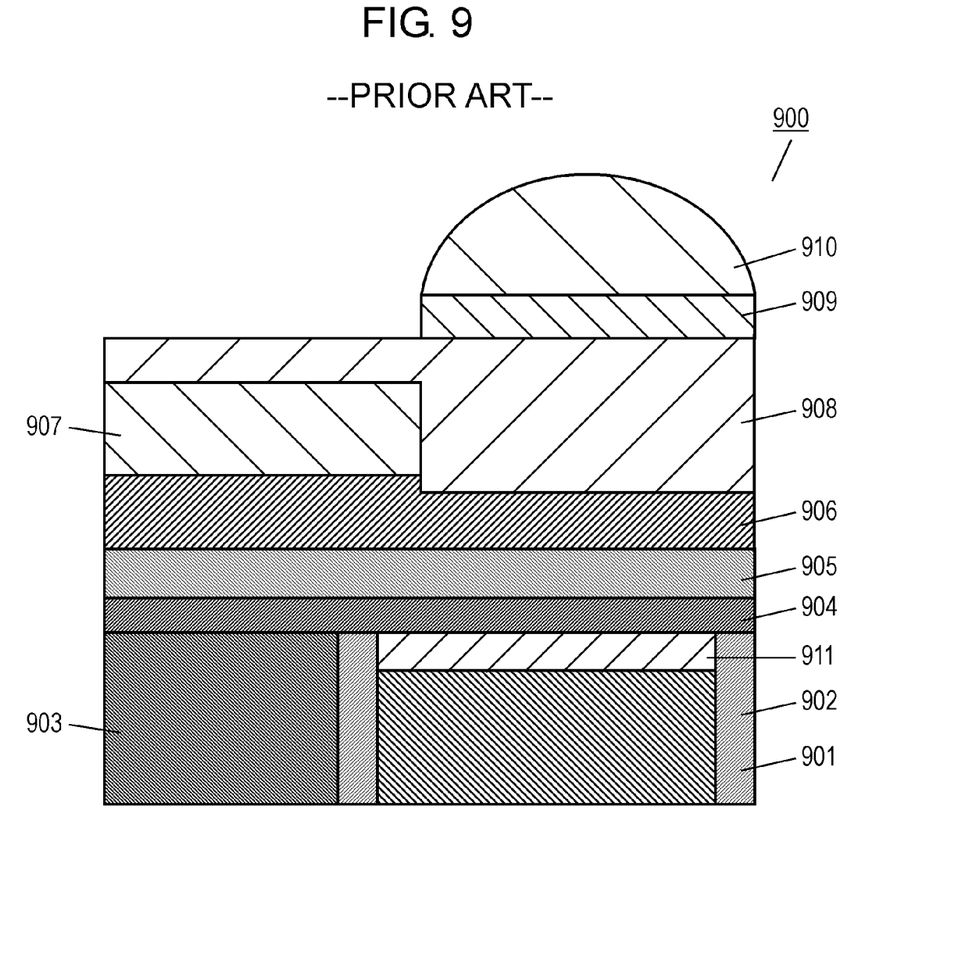
FIG. 9 is a cross-sectional view of a solid-state imaging device of a second conventional technique.

FIG. 9 is a cross-sectional view of solid-state imaging device 900 of the second conventional technique.

Solid-state imaging device 900 of the second conventional technique is a backside-illumination-type solid-state imaging device, and as shown in FIG. 9, includes semiconductor substrate 901, and light receiving section 902 and peripheral circuit section 903 formed on semiconductor substrate 901. Film 904 that lowers an interface level and film 905 including negative fixed charges are formed on light receiving section 902. Insulation film 906 is formed on film 905 including the negative fixed charges, and light-shielding film 907 is formed on insulation film 906 above peripheral circuit section 903. Further, insulation film 908 having transparency to incident light is formed on film 905 having the negative fixed charges above light receiving section 902. Further, color filter layer 909 and light condensing lens 910 are formed on insulation film 908.

In solid-state imaging device 900 of the second conventional technique, since film 905 including the negative fixed charges is formed on film 904 that lowers the interface level, hole accumulation layer 911 is formed on a light receiving surface side of light receiving section 902 due to an electric field caused by the negative fixed charges. Accordingly, the generation of the charges from the interface is suppressed, and the dark current caused due to the interface level can be suppressed.

As described above, solid-state imaging device 800 of the first conventional technique and solid-state imaging device 900 of the second conventional technique form the hole accumulation layer by using the negative fixed charges, and thereby suppress the dark current caused by the interface level.

SUMMARY

However, in solid-state imaging device 800 of the first conventional technique, since the negative fixed charges are embedded into the insulation film by implanting aluminum ions, an additional manufacturing process for implanting aluminum ions is required. In addition, in this additional manufacturing process, aluminum ions need to be implanted with high energy, and there is a problem that this manufacturing process damages the photodiodes.

Further, in solid-state imaging device 900 of the second conventional technique in which film 905 including negative fixed charges is formed, although there is no damage to the photodiodes due to the implantation of aluminum ions as in the first conventional technique, the hole accumulation layer is formed by the electric field caused by the negative fixed charges. Since the amount of the negative fixed charges greatly change depending on a level caused by an interface in the insulation film and between the insulation film and the light receiving section, it is very difficult to control the electric field for sufficiently forming the hole accumulation layer by the film including negative fixed charges.

Further, since the negative fixed charges are prone to disappear by manufacturing processes such as moisture treatment and heat treatment, it is also difficult to control the amount of the negative fixed charges for forming the hole accumulation layer.

As described above, since difficult controls accompany the film including negative fixed charges, even if the hole accumulation layer can be formed sufficiently in a particular pixel region, there may be cases in which the hole accumulation layer cannot be formed sufficiently in other pixel regions. Accordingly, a property variation among pixels becomes large, and there is a problem that a sufficient property as a solid-state imaging device cannot be achieved.

The present invention has been made in view of the above problems, and aims to provide a backside-illumination-type solid-state imaging device that is capable of controlling the dark current caused by the interface level by forming a hole accumulation layer on a light receiving surface of the light receiving section uniformly without any variation among pixels.

An aspect of the solid-state imaging device of the present invention is a solid-state imaging device of a backside-illumination type including: a wiring layer formed on a first surface side of a semiconductor substrate; and a light receiving section that photoelectrically converts light incident from a second surface side that is opposite from the first surface side, wherein a spontaneous polarization film formed of a material having spontaneous polarization is formed on a light receiving surface of the light receiving section.

With this configuration, by the spontaneous polarization of the spontaneous polarization film, the hole accumulation layer can be easily formed on the light receiving surface of the light receiving section uniformly without any variation among pixels. Thus, the dark current by the charges caused by the interface level of the light receiving section can be controlled uniformly over an entirety of the imaging region.

Further, according to the aspect of the solid-state imaging device of the present invention, a direction of polarization of the spontaneous polarization film is preferably a direction from the first surface to the second surface.

With this configuration, the negative charges can be provided on the light receiving surface side of the spontaneous polarization film, so that the hole accumulation layer can be formed in an interface on the light receiving surface of the light receiving section uniformly without any variation among pixels.

Further, according to the aspect of the solid-state imaging device of the present invention, the spontaneous polarization film is preferably of a material in which a crystal is oriented.

With this configuration, the polarization can be generated by the crystal orientation of the spontaneous polarization film, so that an influence of manufacturing processes such as water treatment and heat treatment can be eliminated. Thus, since a change by the manufacturing processes for the negative fixed charges can be almost eliminated, the hole accumulation layer can further be formed uniformly without any variation among pixels.

Further, according to the aspect of the solid-state imaging device of the present invention, the material in which the crystal is oriented is any one selected from ZnO, GaN, AlN, $SrTiO_3$, $Pb(Zr, Ti)O_3$, $SrBi_2Ta_2O_9$, $(Bi, La)_4Ti_3O_{12}$, $BaTiO_3$, $BiFeO_3$, and $Ba_xSr_{(1-x)}TiO_3$.

With this configuration, since an amount of the spontaneous polarization of the spontaneous polarization film can be increased, a sufficient hole accumulation layer can further be formed on the light receiving surface, and it becomes possible to effectively suppress the dark current.

Further, according to the aspect of the solid-state imaging device of the present invention, the material in which the crystal is oriented is preferably formed at a deposition temperature of 400° C. or less.

Accordingly, the deposition of the spontaneous polarization film can be performed even after having formed the wirings, and the manufacturing process can be simplified.

Further, according to the aspect of the solid-state imaging device of the present invention, the material in which the crystal is oriented is preferably ZnO, and conductivity type of the ZnO is preferably p-type.

Accordingly, it becomes easier to form the hole accumulation layer by a band structure of the ZnO film and the semiconductor substrate on which the ZnO film is formed, and effectively suppress the dark current.

Further, according to the aspect of the solid-state imaging device of the present invention, the material in which the crystal is oriented is preferably ZnO, and an oxygen defect concentration of the ZnO is preferably $1 \times 10^{17}$ (piece/cm$^3$) or less.

Accordingly, it becomes easier to form the hole accumulation layer by the band structure of the ZnO film and the semiconductor substrate on which the ZnO film is formed, and effectively suppress the dark current.

Further, according to the aspect of the solid-state imaging device of the present invention, the spontaneous polarization film is preferably made of an organic material having polarization, and polarized charges of the organic material are preferably generated in a direction of film growth of the organic material by an orientation of the organic material.

With this configuration, since the spontaneous polarization film can be formed by the low-temperature manufacturing process, the amount of the spontaneous polarization can be increased.

Further, according to the aspect of the solid-state imaging device of the present invention, the spontaneous polarization film is preferably a fluoropolymer.

With this configuration, since the spontaneous polarization film can be formed from a low molecular material made of a low molecular mass body, deposition using a vacuum deposition method or the like by which the control of the film thickness and orientation can be performed relatively easily becomes possible.

Further, according to the aspect of the solid-state imaging device of the present invention, the spontaneous polarization film is preferably covered by a hydrogen barrier film.

With this configuration, intrusion of hydrogen that deteriorates spontaneous polarization property of the spontaneous polarization film can be suppressed. Thus, in a manufacturing process such as water treatment and hydrogen annealing, the deterioration of the spontaneous polarization property of the spontaneous polarization film can be suppressed, and a sufficient hole accumulation layer can be formed on the light receiving surface.

Further, according to the aspect of the solid-state imaging device of the present invention, the spontaneous polarization film is preferably sandwiched by hydrogen barrier films.

Accordingly, the deterioration of the spontaneous polarization property of the spontaneous polarization film can be suppressed.

Further, according to the aspect of the solid-state imaging device of the present invention, the spontaneous polarization film is preferably formed of two or more layers of spontaneous polarization films being laminated.

With this configuration, compared to a case of forming the spontaneous polarization film with a single layer, a region in which the hole accumulation layer cannot be formed sufficiently due to an interface of grains formed by the spontaneous polarization film is reduced; and further, the hole accumulation layer can be formed uniformly without any variation among pixels According to the solid-state imaging device of the present invention, the hole accumulation layer can be formed on the light receiving surface of the light receiving section uniformly without any variation between pixels. Thus, the dark current caused by the interface level can effectively be suppressed.

DESCRIPTION OF EMBODIMENTS

Hereinbelow, a solid-state imaging device of embodiments of the present invention will be described with reference to the drawings.

First Exemplary Embodiment

Figure 1:
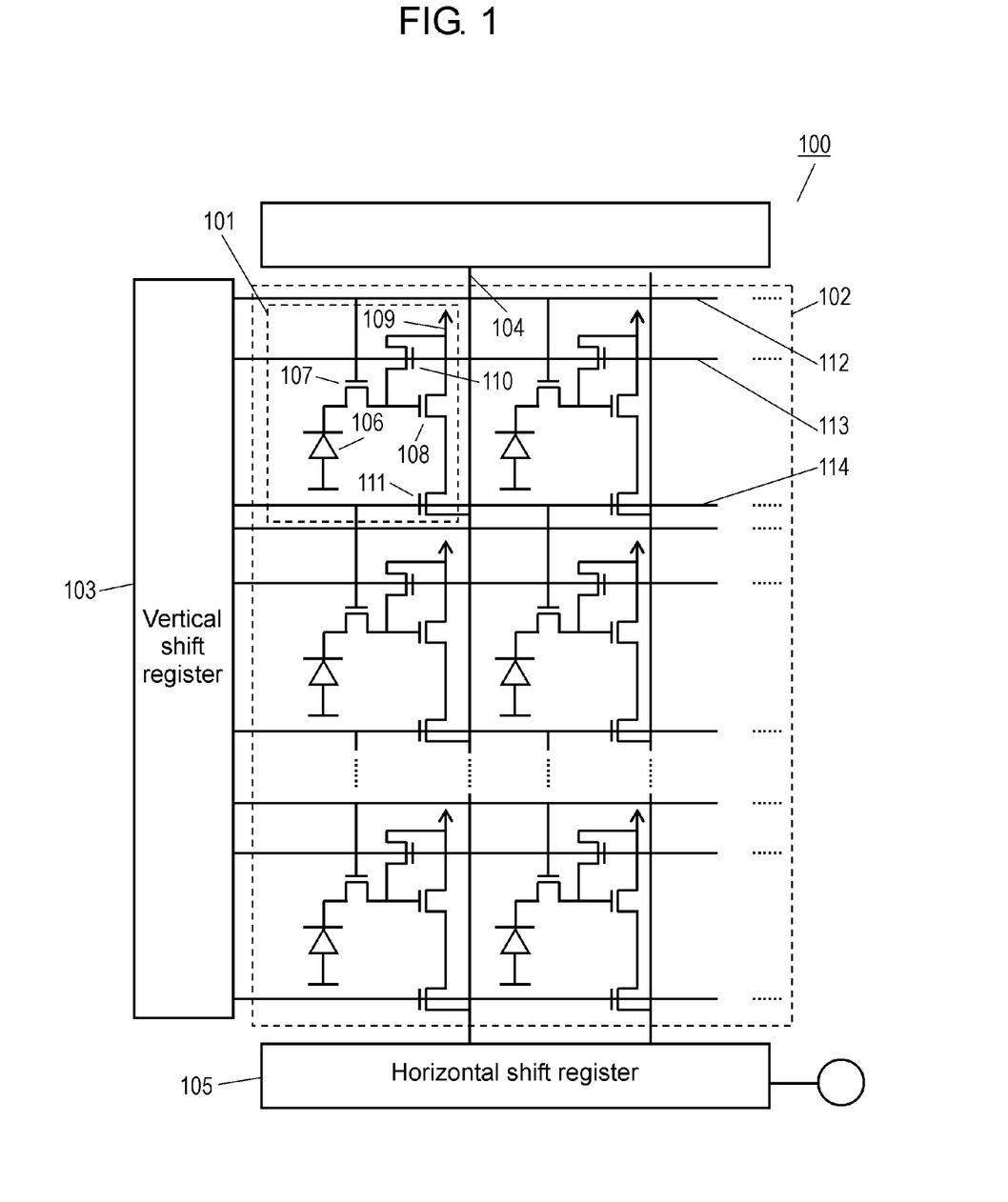
FIG. 1 is a diagram showing a circuit configuration of a solid-state imaging device of a first exemplary embodiment of the present invention.

FIG. 1 is a diagram showing a circuit configuration of solid-state imaging device 100 of a first exemplary embodiment of the present invention.

As shown in FIG. 1, solid-state imaging device 100 of the first exemplary embodiment of the present invention includes imaging region 102 in which a plurality of pixels 101 are arranged in a matrix, vertical shift register 103 for selecting pixel 101, and horizontal shift register 105 that transmits a signal outputted from pixel 101 through output signal line 104.

Pixel 101 is made of photoelectric conversion element 106 that is for example a photodiode, transfer transistor 107 that transfers charges generated in photoelectric conversion section 106 to a floating diffusion section (FD section), amplifying transistor 108 that amplifies a charge signal stored in the FD section and outputs the amplified charge signal to output signal line 104, resetting transistor 110 that has one end connected to power voltage supplying section 109 and resets a state of the FD section, and selecting transistor 111 that controls whether or not to output the signal that is amplified by amplifying transistor 108 to output signal line 104. A gate electrode of transfer transistor 107, a gate electrode of resetting transistor 110 and a gate electrode of selecting transistor 111 are respectively connected to their corresponding output pulse lines 112, 113, 114 that are respectively controlled by vertical shift register 103.

Note that, the above configuration of pixels 101 is merely an example, and a circuit configuration can be adapted to the solid-state imaging device of the present invention so long as one or more photoelectric conversion elements 106 are arranged within each pixel 101. Further, by adapting the structure of photoelectric conversion elements 106 of the present embodiment to a MOS type solid-state imaging device, it is possible to provide peripheral circuits (vertical shift register 103, horizontal shift register 105, signal output circuit, column amplifier and the like) on the same chip as imaging region 102. In this case, reduction of area and shortening a signal processing time and the like can be achieved. Further, it is also possible to adapt the structure of photoelectric conversion elements 106 of the present embodiment to a CCD type solid-state imaging device.

Figure 2:
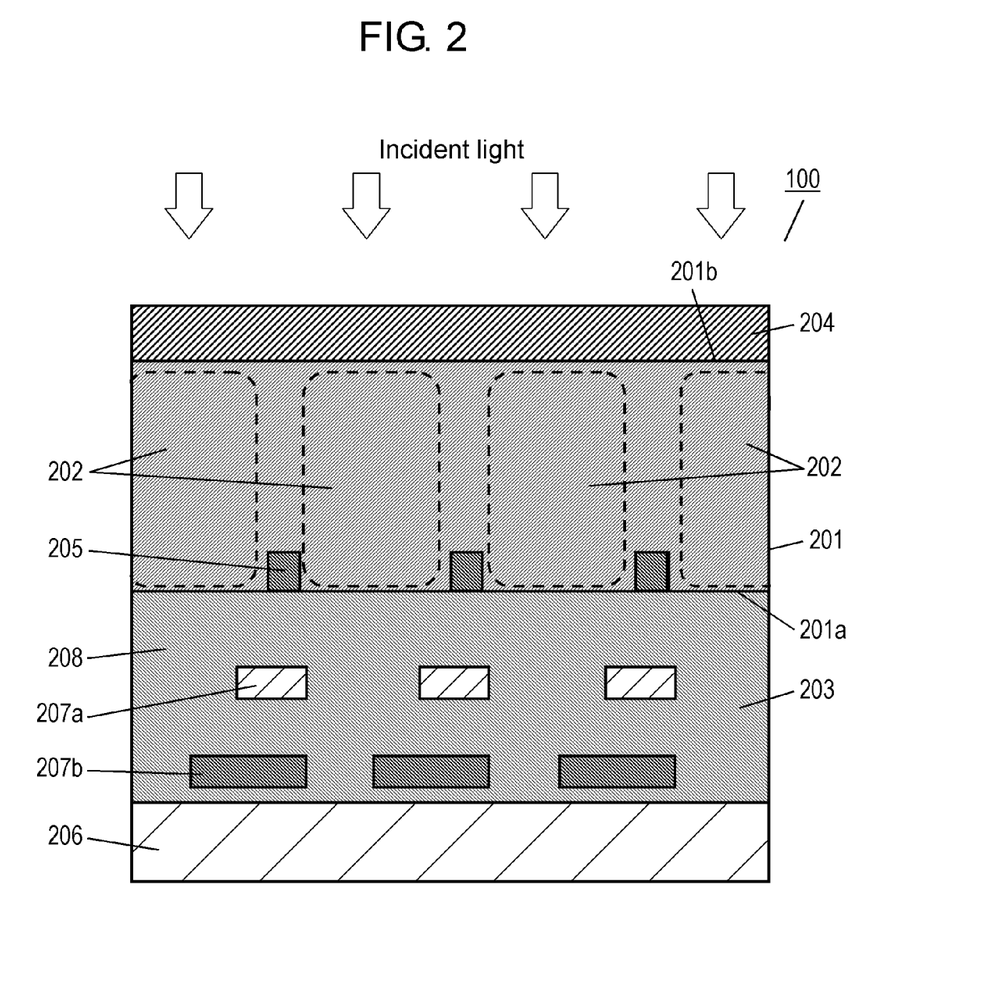
FIG. 2 is a diagram schematically showing a cross section of pixels in the solid-state imaging device of the first exemplary embodiment of the present invention.

FIG. 2 is a diagram schematically showing a cross section of pixels 101 in solid-state imaging device 100 of the first exemplary embodiment of the present invention. The solid-state imaging device of the present embodiment is a backside-illumination-type solid-state imaging device, and has a structure in which light is made incident from an opposite surface from a surface on which the wiring layer is formed.

As shown in FIG. 2, solid-state imaging device 100 of the first exemplary embodiment of the present invention includes semiconductor substrate 201, light receiving sections 202 formed of pn photodiodes formed on semiconductor substrate 201, wiring layer 203 formed on first surface 201a (front surface) of semiconductor substrate 201, and spontaneous polarization film 204 formed at least on a light receiving surface side of light receiving sections 202 on semiconductor substrate 201. Further, element isolation sections 205 that separate light receiving sections 202 are formed in semiconductor substrate 201. On an opposite side of the side from which the light is incident of wiring layer 203, supporting substrate 206 formed of a silicon substrate or glass substrate is provided.

In the present embodiment, light receiving sections 202 are formed corresponding to respective pixels 101 of imaging region 102 shown in FIG. 1; and they photoelectrically convert the light incident (incident light) from second surface 201b (back surface) that is the opposite side surface of first surface 201a of semiconductor substrate 201. Light receiving sections 202 output pixel signals based on the charges generated according to a light receiving amount of the incident light. Light receiving sections 202 can be configured for example by forming pn junctions on the semiconductor substrate. Specifically, n-type silicon substrate is used as semiconductor substrate 201, a p-type semiconductor well region is formed on the n-type silicon substrate, and n-type semiconductor regions are formed on the p-type semiconductor well region, whereby the pn photodiodes are formed.

Wiring layer 203 is made of a plurality of wirings 207a, 207b for outputting the pixel signals generated in light receiving sections 202 to outside and the like, and interlayer insulating film 208 for insulating the plurality of wirings 207a, 207b. Wirings 207a, 207b are for example made of aluminum wirings formed of aluminum. Note that, although wirings 207a, 207b are formed in a two-layer structure in the solid-state imaging device shown in FIG. 2, the configuration thereof is not limited to this. For example, wirings 207a, 207b may be formed as a multiple-layer wiring structure in which three or more plural types of wirings are laminated in two or more layers. In the present embodiment, for example, output signal line 104 or output pulse lines 112, 113, 114 shown in FIG. 1 may be formed as wirings with the multiple-layer wiring structure.

Spontaneous polarization film 204 is formed on the light receiving surface of light receiving sections 202, and in the present embodiment, it is formed on a second surface 201b side of semiconductor substrate 201 that is the light receiving surface side of light receiving sections 202. This spontaneous polarization film 204 is a film having spontaneous polarization, and is made of a material having an electric dipole in which centers of balance of positive and negative charges spontaneously separate. If light receiving sections 202 are the pn photodiodes in the case of using the n-type silicon substrate, spontaneous polarization film 204 is polarized so that the light incident side of spontaneous polarization film 204 is positive and light receiving section 202 side is negative. Accordingly, holes are induced to an interface on the light receiving surface side of light receiving sections 202 (n-type semiconductor region), and the hole accumulation layer is formed.

In the present embodiment, backside-illumination-type solid-state imaging device 100 is manufactured using an SOI substrate provided by forming a silicon substrate on an insulation film on a substrate. In this case, light receiving sections 202 and wiring layer 203 are formed on the silicon substrate on the insulation film of the SOI substrate, supporting substrate 206 formed of silicon substrate is bonded on wiring layer 203, and thereafter the other substrate of the SOI substrate is removed. The removal of the other substrate can be performed by dry etching or wet etching with the insulation film of the SOI substrate as an etching stopper layer, or physical polishing. Note that, although the method of using the SOI substrate has been described as a mere example, manufacture by using a conventional substrate instead of using the SOI substrate is also possible.

Further, in the present embodiment, although the silicon substrate is used as supporting substrate 206, a glass substrate can also be used as supporting substrate 206. Note that, supporting substrate 206 is not limited to the silicon substrate or the glass substrate. Supporting substrate 206 can be replaced with any material so long as it is capable of maintaining strength of a substrate with respect to handling in the event where the substrate onto which devices such as the light receiving sections are formed becomes thin.

As described above, a step of removing the substrate in order to use the SOI substrate becomes required to manufacture the backside-illumination-type solid-state imaging device. In this step of removing the substrate, since the physical polishing, dry etching, wet etching and the like will be performed, the surface of the light receiving sections on which the light is incident is damaged in a way which would not occur in a frontside-illumination-type solid-state imaging device. Accordingly, in the light receiving sections, an interface level caused by the damage in the step of removing the substrate is present, and the dark current is generated thereby.

Contrary to this, solid-state imaging device 100 of the first exemplary embodiment of the present invention, since spontaneous polarization film 204 is formed on the side of the surface of light receiving sections 202 on which the light is incident, the hole accumulation layer can be formed on the side of the surface of light receiving sections 202 on which the light is incident by the spontaneous polarization of spontaneous polarization film 204. Accordingly, noise charges generated in the interface level can be reduced, and the dark current can be suppressed. Moreover, since spontaneous polarization film 204 can easily be deposited uniformly with respect to the respective pixels, the spontaneous polarization film having the same spontaneous polarization with respect to the light receiving section of each pixel can be formed. Thus, since the hole accumulation layer can be formed on the light receiving section uniformly without any variation among the pixels, the dark current of the entirety of the imaging region can be suppressed effectively.

Note that, FIG. 2 is depicted to exemplify only the characteristic configuration of the solid-state imaging device of the present embodiment, so that other configurations such as color filters and microlens are omitted. Further, the shapes of the configuration shown in FIG. 2 are not limited to this; in a backside-illumination-type solid-state imaging device having the configuration to receive the light incident from the surface opposite from the surface from which the substrate is removed and on which the wiring layer is formed, similar effect to that described above can be achieved.

Figure 3:
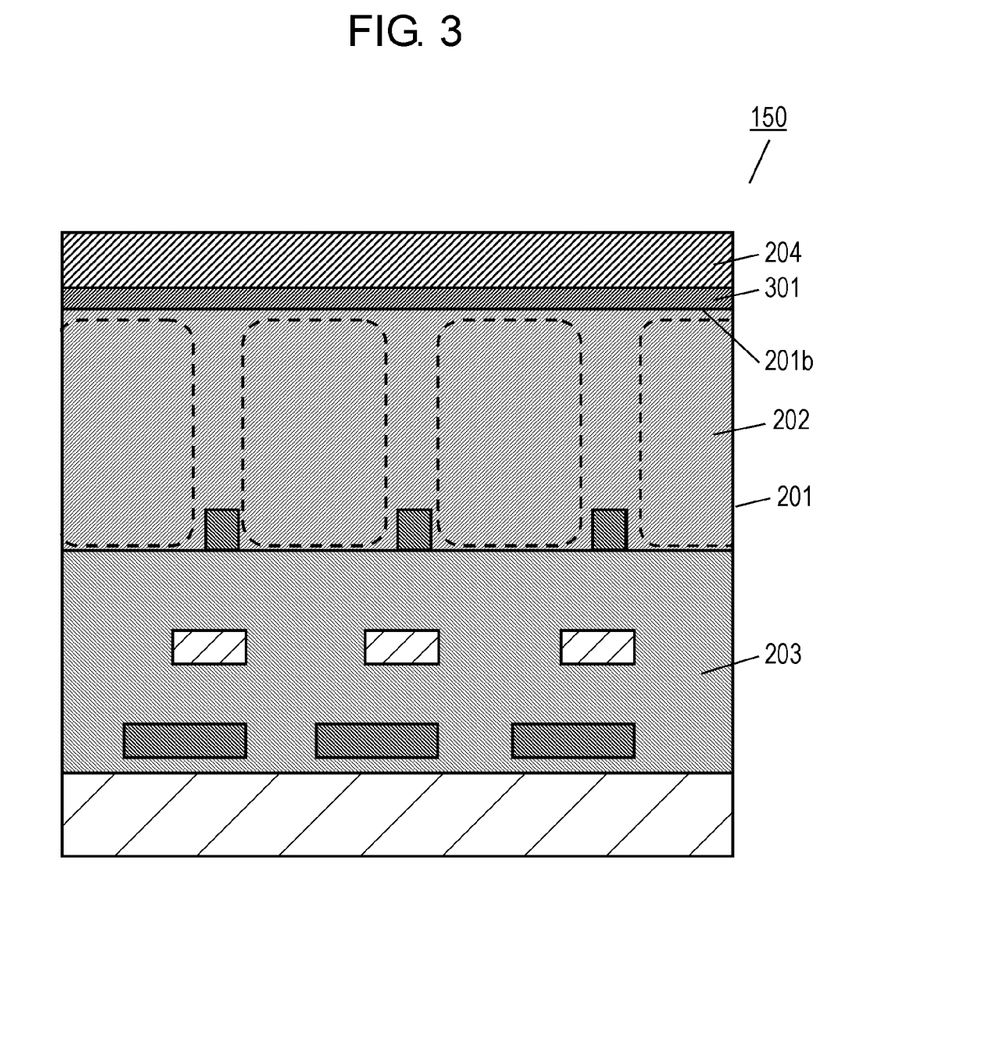
FIG. 3 is a diagram schematically showing a cross section of pixels in a solid-state imaging device of a modification of the first exemplary embodiment of the present invention.

Further, in solid-state imaging device 100 shown in FIG. 2, although spontaneous polarization film 204 is formed directly on light receiving sections 202 of semiconductor substrate 201, spontaneous polarization film 204 can be formed via insulation film 301 so long as it is formed on light receiving sections 202, as in solid-state imaging device 150 shown in FIG. 3. That is, as shown in FIG. 3, insulation film 301 may be formed on semiconductor substrate 201 on light receiving sections 202, and spontaneous polarization film 204 may be formed on insulation film 301. Insulation film 301 can be formed for example from $SiO_2$ film, SiN film, SiON film and the like.

In solid-state imaging device 150 shown in FIG. 3, holes are induced at an interface with insulation film 301 of light receiving sections 202 by spontaneous polarization film 204 having polarization. Accordingly, the hole accumulation layer is formed on the light receiving surface side of light receiving sections 202. Thus, similar to solid-state imaging device 100 shown in FIG. 2, noise charges generated at the interface level can be reduced, and the dark current can be suppressed. Further, similarly, since spontaneous polarization film 204 can easily be deposited uniformly with respect to the respective pixels, there is no variation among the pixels, and the dark current can also be suppressed.

In solid-state imaging devices 100 and 150 shown in FIG. 2 and FIG. 3, spontaneous polarization film 204 preferably has an orientation of its polarization in the same direction from first surface 201a of semiconductor substrate 201 to second surface 201b. That is, it is preferable for the orientation to be in a direction vertical to a main surface of semiconductor substrate 201 and that extends from the side on which wiring layer 203 of semiconductor substrate 201 is formed to the side on which the light is incident.

As described above, by configuring the orientation of the polarization of spontaneous polarization film 204 to be in the direction from first surface 201a to second surface 201b, the orientation of the polarization is indicated by a vector of the polarization from a negative charge side to a positive charge side. Accordingly, negative charges can be formed on the side of light receiving sections 202 of spontaneous polarization film 204, and positive charges can be accumulated on the light incident side of spontaneous polarization film 204. Thus, the hole accumulation layer can be formed on the interface of the light receiving surface of light receiving sections 202 uniformly without any variation among the pixels, and the dark current can be suppressed effectively.

Further, in solid-state imaging devices 100 and 150 shown in FIG. 2 and FIG. 3, spontaneous polarization film 204 is preferably of a material in which a crystal is oriented.

Thus, by configuring the material of spontaneous polarization film 204 as the material in which the crystal is oriented, the polarization can be maintained according to the crystal being oriented. Accordingly, the change in an amount of the polarization in the spontaneous polarization film caused by the manufacturing processes such as the water treatment and heat treatment can be almost eliminated. Thus, since a stable hole accumulation layer which is less susceptible to outside influences can be formed on the interface of light receiving sections 202 uniformly without any variation among the pixels, the dark current can be suppressed effectively. Here, as the material in which the crystal is oriented, for example, it may be any one selected from among ZnO (zinc oxide), GaN (gallium nitride), AlN (aluminum nitride), $SrTiO_3$ (strontium titanate), $Pb(Zr, Ti)O_3$ (lead zirconate titanate), $SrBi_2Ta_2O_9$ (strontium bismuth tantalate), $(Bi, La)_4Ti_3O_{12}$ (lanthanum bismuth titanate), $BaTiO_3$ (barium titanate), $BiFeO_3$ (ferric acid bismuth), and $Ba_xSr_{(1-x)}TiO_3$BST (solid solution of barium titanate and strontium titanate).

Since spontaneous polarization film 204 formed by the above material has a large amount of spontaneous polarization, a further stabilized hole accumulation layer can be formed, and the dark current can be suppressed even more effectively.

Note that, spontaneous polarization film 204 formed using the above material can be formed by performing deposition of the above material by using sputtering, sol-gel method, electron beam vapor deposition method, and the like. Further, during formation of spontaneous polarization film 204 or after the formation of spontaneous polarization film 204, the amount of polarization of spontaneous polarization film 204 can be increased by performing a process to increase crystalline such as high-temperature processing.

Further, the component selected from the above materials is preferably deposited under 400° C. or less. Accordingly, since the material in which the crystal is oriented can be formed after having formed the wirings, the manufacturing process can be simplified.

Figure 4:
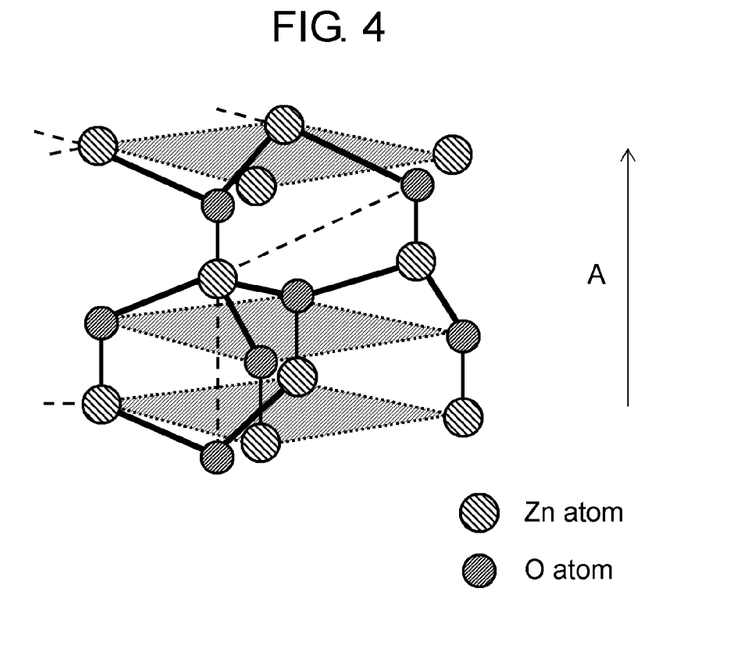
FIG. 4 is a diagram schematically showing a crystal structure of ZnO.

As an example, a case of having formed spontaneous polarization film 204 with ZnO will be described. FIG. 4 is a diagram schematically showing a crystal structure of ZnO. As shown in FIG. 4, ZnO has a Wurz structure, and an upward spontaneous polarization vector (direction of arrow A) is indicated by the orientation of Zn atoms and O atoms. A concentration of a charge amount of the spontaneous polarization of ZnO is about 5 ($\mu C/cm^2$), so that the number of holes induced on light receiving sections 202 by this spontaneous polarization of ZnO is about $3 \times 10^{13}$ (piece/$cm^2$). Thus, a stable and sufficient hole accumulation layer can be formed on light receiving sections 202, and the dark current can be suppressed as desired.

Note that, in the case where the material in which the crystal is oriented is ZnO, the conductivity of ZnO is preferably p-type. Accordingly, a potential at a junction portion of ZnO and Si of semiconductor substrate 201 comes to be in a structure in which the holes are easily accumulated, and the dark current can be suppressed effectively. Further, in the case where the material in which the crystal is oriented is ZnO, the oxygen defect concentration of the ZnO is preferably $1 \times 10^{17}$ (piece/$cm^3$) or less. Accordingly, the potential at the junction portion of ZnO and Si of semiconductor substrate 201 comes to be in a structure in which the holes are easily accumulated, and the dark current can be suppressed effectively.

Further, in solid-state imaging devices 100 and 150 shown in FIG. 2 and FIG. 3, spontaneous polarization film 204 may be made of an organic material having polarization, and polarized charges of the organic material may be generated in the direction of film growth of the organic material by the orientation of the organic material.

By configuring spontaneous polarization film 204 as above, since spontaneous polarization film 204 can be formed at low-temperature, the amount of the spontaneous polarization can be increased. Thus, the hole accumulation layer that is sufficient to suppress the dark current can be formed.

Such spontaneous polarization film 204 can be formed by using fluoropolymer.

Figure 5:
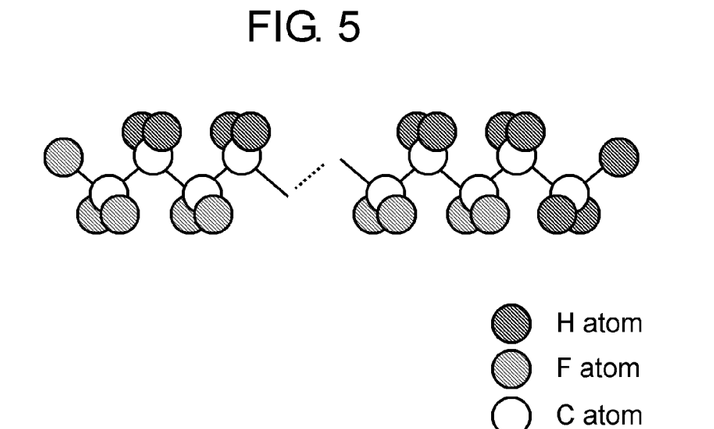
FIG. 5 is a diagram schematically showing a molecular chain structure of a PVDF.

As an example, a case of having formed spontaneous polarization film 204 with a PVDF (polyvinylidene fluoride) that is the fluoropolymer will be described. FIG. 5 is a diagram schematically showing a molecular chain structure of the PVDF. As shown in FIG. 5, since the PVDF is a low molecular material formed of a low molecular mass body having ($-CH_2CF_2-$) as a monomer unit, thermal decomposition of molecular chains is unlikely to occur, and mixing of the impurities is rare. Accordingly, the deposition for example using a method, such as the vacuum deposition method, by which the control of the film thickness and orientation can be performed relatively easily becomes possible. Thus, as in the solid-state imaging device of the present embodiment, it is especially suitable for the manufacture of the backside-illumination-type solid-state imaging device that performs formation of the spontaneous polarization film after having formed the wiring layer. A concentration of a charge amount of the spontaneous polarization of PVDF is about 13 ($\mu C/cm^2$), so that the number of holes induced on light receiving sections by this spontaneous polarization of PVDF is about $1 \times 10^{14}$ (piece/$cm^2$). Thus, a sufficient hole accumulation layer can be formed, and the dark current can be suppressed as desired.

Second Exemplary Embodiment

Figure 6:
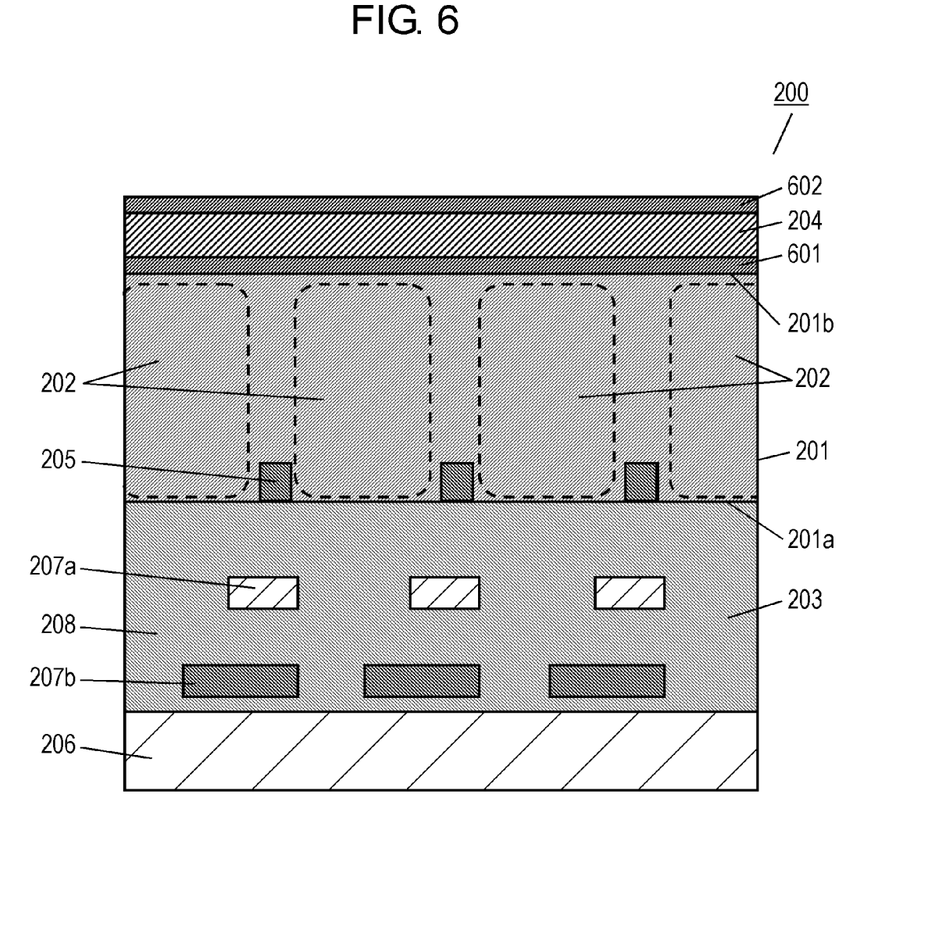
FIG. 6 is a diagram schematically showing a cross section of pixels in a solid-state imaging device of a second exemplary embodiment of the present invention.

Next, solid-state imaging device 200 of the second exemplary embodiment of the present invention will be described with reference to FIG. 6. FIG. 6 is a diagram schematically showing a cross section of pixels in solid-state imaging device 200 of the second exemplary embodiment of the present invention.

Note that, an overall configuration of solid-state imaging device 200 of the second exemplary embodiment of the present invention is similar to that of solid-state imaging device 100 of the first exemplary embodiment of the present invention shown in FIG. 1, and therefore a description thereof will be omitted. Further, a basic configuration of the pixel of solid-state imaging device 200 of the second exemplary embodiment of the present invention shown in FIG. 6 is similar to that of solid-state imaging device 100 of the first exemplary embodiment of the present invention shown in FIG. 2, and therefore a description thereof will be omitted. Thus, in FIG. 6, same reference numbers are given to identical constitutional components to those shown in FIG. 2, and their description is either simplified or omitted, and configurations of characteristic sections will be described in detail.

As shown in FIG. 6, solid-state imaging device 200 of the second exemplary embodiment of the present invention has a configuration in which spontaneous polarization film 204 is sandwiched between hydrogen barrier films 601 and 602 formed of SiN. That is, as shown in FIG. 6, this configuration has hydrogen barrier film 601 formed at least on the light receiving surface of light receiving sections 202 of semiconductor substrate 201, spontaneous polarization film 204 formed on this hydrogen barrier film 601, and further hydrogen barrier film 602 formed on spontaneous polarization film 204.

As described above, by having the configuration of sandwiching spontaneous polarization film 204 between hydrogen barrier films 601 and 602, an amount of the spontaneous polarization of spontaneous polarization film 204 can be suppressed from being decreased in the manufacturing process such as water treatment and hydrogen annealing.

Thus, in solid-state imaging device 200 of the second exemplary embodiment of the present invention, a more stabilized hole accumulation layer can be formed uniformly over the entirety of the imaging region on the side of the surface on which light is incident of light receiving sections 202 than in solid-state imaging device 100 of the first exemplary embodiment of the present invention. Accordingly, noise charges generated in the interface level can be reduced uniformly without any variation among the pixels, and the dark current can be suppressed uniformly at the entirety of the imaging region.

Note that, in the present embodiment, although hydrogen barrier films 601 and 602 are formed by SiN films, they may be formed by any one selected from among TiN film, $Al_2O_3$ film, TiAlO film, TaAlO film, TiSiO film, and TaSiO film.

Further, the material selected from the above materials is preferably deposited under 400° C. or less. Accordingly, since the material in which the crystal is oriented can be formed after having formed the wirings, the manufacturing process can be simplified.

Further, in the present embodiment, although hydrogen barrier films 601 and 602 are formed above and under spontaneous polarization film 204 in a manner of sandwiching spontaneous polarization film 204, hydrogen barrier film 602 may be formed only on an upper side of spontaneous polarization film 204 so as to cover spontaneous polarization film 204 from the upper side (side from which the light is incident). Note that, in the case of having formed hydrogen barrier film 602 only on the upper side of spontaneous polarization film 204, it is preferable to form an insulation film (not shown) formed of SiN film and the like between light receiving sections 202 of semiconductor substrate 201 and spontaneous polarization film 204.

Third Exemplary Embodiment

Figure 7:
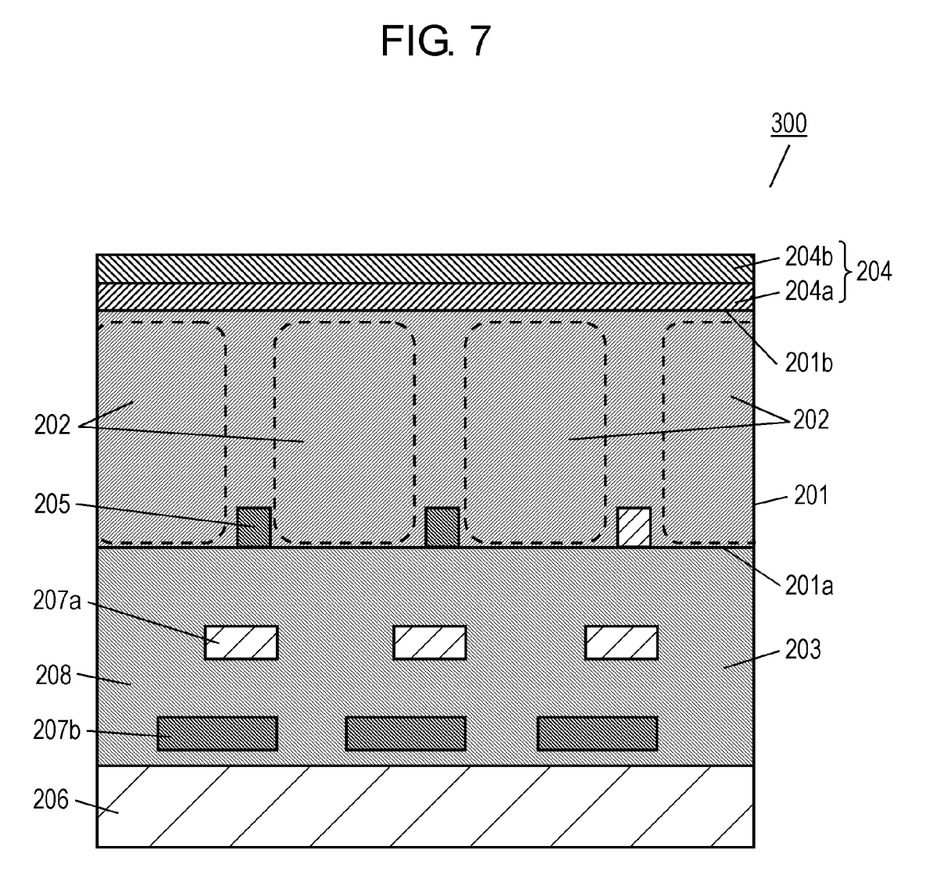
FIG. 7 is a diagram schematically showing a cross section of pixels in a solid-state imaging device of a third exemplary embodiment of the present invention.

Next, solid-state imaging device 300 of a third exemplary embodiment of the present invention will be described with reference to FIG. 7. FIG. 7 is a diagram schematically showing a cross section of pixels in solid-state imaging device 300 of the third exemplary embodiment of the present invention.

Note that, an overall configuration of solid-state imaging device 300 of the third exemplary embodiment of the present invention is similar to that of solid-state imaging device 100 of the first exemplary embodiment of the present invention shown in FIG. 1, and therefore a description thereof will be omitted. Further, a basic configuration of the pixel of solid-state imaging device 300 of the third exemplary embodiment of the present invention shown in FIG. 7 is similar to that of solid-state imaging device 100 of the first exemplary embodiment of the present invention shown in FIG. 2. Thus, in FIG. 7, same reference numbers are given to identical constitutional components to those shown in FIG. 2, and their description is either simplified or omitted, and configurations of characteristic sections will be described in detail.

As shown in FIG. 7, solid-state imaging device 300 of the third exemplary embodiment of the present invention has a configuration in which spontaneous polarization film 204 is formed by laminating two layers of spontaneous polarization films. That is, as shown in FIG. 7, in the present embodiment, spontaneous polarization film 204 includes first spontaneous polarization film 204a formed at least on the light receiving surface of light receiving sections 202 of semiconductor substrate 201, and second spontaneous polarization film 204b formed on first spontaneous polarization film 204a. Note that, although spontaneous polarization film 204 has a two-layer structure in the solid-state imaging device shown in FIG. 7, spontaneous polarization film 204 may be formed of two or more plural layers.

Accordingly, by configuring spontaneous polarization film 204 with plural layers, the hole accumulation layer that is uniform and sufficient can be formed on the light receiving sections of the pixels in an entire imaging region, compared to the case of configuring spontaneous polarization film 204 by a single layer. Thus, the dark current can be efficiently suppressed without any variation among pixels.

This is because by forming spontaneous polarization film 204 in plural layers, the occurrence of a region in which the hole accumulation layer cannot be formed sufficiently due to an interface of grains formed by spontaneous polarization film 204 can be reduced. Hereinbelow, this point will be described in detail.

The grains (grain boundary) is a region in which crystal is intermittently formed, and in the interface of the grains of the spontaneous polarization film, the effect of the spontaneous polarization is small, so that the hole accumulation layer cannot be formed sufficiently. Accordingly, if a boundary of the grains is formed on the light receiving sections, the concentration of the hole accumulation layer caused by spontaneous polarization vary among the pixels, so that the dark current cannot be controlled uniformly. However, as in the present embodiment, if the spontaneous polarization film has a laminate structure with two or more layers, even if the boundary of the grains is formed in the first layer of spontaneous polarization film, the second layer of spontaneous polarization film is formed on this boundary of the grains in the first layer of spontaneous polarization film, and the hole accumulation layer is formed by the second layer of spontaneous polarization film; thus, the case with the spontaneous polarization film having two layers has lower possibility that the region in which the hole accumulation layer cannot be formed sufficiently due to the interface of grains being present, compared to the case of the spontaneous polarization film being a single layer. Thus, a sufficient hole accumulation layer can be formed as the number of layers of the spontaneous polarization film is increased.

Accordingly, in solid-state imaging device 300 of the third exemplary embodiment of the present invention, by configuring spontaneous polarization film 204 with the laminated structure of plural layers, the occurrence of the region in which the hole accumulation layer cannot be formed sufficiently due to the interface of the grains formed in spontaneous polarization film 204 can be reduced, and the concentration of hole accumulation layer induced by spontaneous polarization film 204 can be made uniform among the pixels over the entirety of the imaging region. Thus, the dark current can be suppressed uniformly without any variation among pixels. Note that, spontaneous polarization film 204 can remove the variation among the pixels as the number of the spontaneous polarization film to be laminated increases, and the uniformity in the formation of the hole accumulation layer over an entirety of the imaging region can be improved.

As described above, in the present embodiment, although the film configuring the plural layers of spontaneous polarization films is configured by the same material, the same effect can be achieved even in forming the above films by different materials. Examples of the material of the films configuring the plural layers of spontaneous polarization film 204 include ZnO, GaN, AlN, $SrTiO_3$, $Pb(Zr,Ti)O_3$, $SrBi_2Ta_2O_9$, $(Bi,La)_4Ti_3O_{12}$, $BaTiO_3$, $BiFeO_3$ and $Ba_xSr_{(1-x)}TiO_3$, and the film may be configured by selecting one of the above or may be configured by combining plural types of the above.

As above, the solid-state imaging device of the present invention has been described based on the respective embodiments, however, the solid-state imaging device of the present invention is not limited to these embodiments. Further, characteristic configurations described in the solid-state imaging device of each embodiment can be adapted to one another. For example, the hydrogen barrier film in the solid-state imaging device of the second exemplary embodiment of the present invention may be adapted to the solid-state imaging device of the third exemplary embodiment of the present invention. Further, respective constitutional components in the plurality of embodiments may be combined as desired without departing from the spirit and scope of the present invention; further, various modifications that would be conceived by those skilled in the art without departing from the spirit and scope of the present invention are also included in the scope of the present invention.

Further, the solid-state imaging device of the embodiment of the present invention has the feature in peripheral configuration of the light receiving sections that performs photoelectric conversion, and as a circuit configuration, a circuit configuration of a typical MOS type solid-state imaging device can be adapted. Further, as for the manufacturing process of bonding the supporting substrate and removing the substrate, a manufacturing process for a typical backside-illumination-type solid-state imaging device can be adapted.

Note that, in the present description, "solid-state imaging device" refers to a device including photoelectric conversion elements provided on a semiconductor chip, and that is for outputting the image signals to outside; and "imaging device" refers to an imaging apparatus having the solid-state imaging device, such as a digital still camera, digital video camera, cell phone camera, surveillance camera.

The solid-state imaging device of the present invention is useful for various types of imaging devices with a function to take a picture, such as the digital still cameras, cell phones, video cameras, surveillance cameras.

What is claimed is:

1. A solid-state imaging device of a backside-illumination type comprising:
a wiring layer formed on a first surface of a semiconductor substrate; and
a light receiving section that photoelectrically converts light incident from a second surface of the semiconductor substrate that is opposite from the first surface, wherein:
a spontaneous polarization film formed of a material having spontaneous polarization is formed on the second surface, and
the spontaneous polarization film is formed of two or more layers of spontaneous polarization films being laminated.

2. The solid-state imaging device according to claim 1, wherein
a direction of polarization of the spontaneous polarization film is a direction from the first surface to the second surface.

3. The solid-state imaging device according to claim 1, wherein
the spontaneous polarization film is of a material in which a crystal is oriented.

4. The solid-state imaging device according to claim 3, wherein
the material in which the crystal is oriented is any one selected from ZnO, GaN, AlN, $SrTiO_3$, $Pb(Zr, Ti)_3$, $SrBi_2Ta_2O_9$, $(Bi, La)_4Ti_3O_{12}$, $BaTiO_3$, $BiFeO_3$, and $Ba_xSr_{(1-x)}TiO_3$.

5. The solid-state imaging device according to claim 3, wherein
the material in which the crystal is oriented is formed at a deposition temperature of 400° C. or less.

6. The solid-state imaging device according to claim 3, wherein
the material in which the crystal is oriented is ZnO, and conductivity type of the ZnO is p-type.

7. The solid-state imaging device according to claim 3, wherein
the material in which the crystal is oriented is ZnO, and an oxygen defect concentration of the ZnO is $1\times10^{17}$ (piece/$cm^3$) or less.

8. The solid-state imaging device according to claim 1, wherein:
the spontaneous polarization film is made of an organic material having polarization, and
polarized charges of the organic material are generated in a direction of film growth of the organic material by an orientation of the organic material.

9. The solid-state imaging device according to claim 8, wherein
the spontaneous polarization film is a fluoropolymer.

10. The solid-state imaging device according to claim 1, wherein
the spontaneous polarization film is covered by a hydrogen barrier film.

11. The solid-state imaging device of any one according to claim 1, wherein
the spontaneous polarization film is sandwiched by hydrogen barrier films.

12. The solid-state device according to claim 1, wherein:
each of said two or more layers of spontaneous polarization films is made of different material from each other.

13. The solid-state device according to claim 1, wherein:
said two or more layers of spontaneous polarization films include a first film and a second film, and
the first film and the second film are made of different material from each other.

14. The solid-state device according to claim 1, wherein:
a grain boundary is terminated at the interface between said two or more layers of spontaneous polarization films.

* * * * *